(12) United States Patent
Patton

(10) Patent No.: US 11,733,284 B2
(45) Date of Patent: Aug. 22, 2023

(54) SYSTEMS AND METHODS FOR VEHICLE EVENT DETECTION

(71) Applicant: CALAMP CORP., Irvine, CA (US)

(72) Inventor: David B. Patton, Irvine, CA (US)

(73) Assignee: CalAmp Corp., Irvine, CA (US)

(*) Notice: Subject to any disclaimer, the term of this patent is extended or adjusted under 35 U.S.C. 154(b) by 0 days.

(21) Appl. No.: 17/538,427

(22) Filed: Nov. 30, 2021

(65) Prior Publication Data

US 2022/0268824 A1 Aug. 25, 2022

Related U.S. Application Data

(63) Continuation of application No. 16/289,320, filed on Feb. 28, 2019, now Pat. No. 11,187,739.

(51) Int. Cl.
*G01R 31/00* (2006.01)
*B60R 16/023* (2006.01)
*G07C 5/00* (2006.01)

(52) U.S. Cl.
CPC .......... *G01R 31/007* (2013.01); *B60R 16/023* (2013.01); *G07C 5/008* (2013.01)

(58) Field of Classification Search
CPC ...... G01R 31/007; B60R 16/023; G07C 5/008
See application file for complete search history.

(56) References Cited

U.S. PATENT DOCUMENTS

| | | | |
|---|---|---|---|
| 8,489,271 B2 | 7/2013 | Hergesheimer et al. | |
| 8,682,525 B1 | 3/2014 | Kalinadhabhotla et al. | |
| 9,738,125 B1 | 8/2017 | Brickley et al. | |
| 10,173,547 B1 | 1/2019 | Denson | |
| 10,855,093 B2 | 12/2020 | Ruiz-Garcia et al. | |
| 2008/0278229 A1 | 11/2008 | Grundl et al. | |
| 2009/0198399 A1 | 8/2009 | Kubo et al. | |
| 2011/0082621 A1 | 4/2011 | Berkobin et al. | |
| 2012/0026010 A1 | 2/2012 | Owens et al. | |
| 2013/0311074 A1 | 11/2013 | Siira | |
| 2014/0074353 A1 | 3/2014 | Lee et al. | |
| 2017/0200329 A1 | 7/2017 | Rajakondala | |
| 2017/0203719 A1 | 7/2017 | Whitlock et al. | |

(Continued)

FOREIGN PATENT DOCUMENTS

| DE | 102018204681 A1 | 9/2018 |
|---|---|---|
| JP | 2001034368 A | 2/2001 |

(Continued)

OTHER PUBLICATIONS

KR 20180029184 A with English translation. Published Mar. 2018. (Year: 2018).*

(Continued)

*Primary Examiner* — Calvin Cheung
(74) *Attorney, Agent, or Firm* — Barnes & Thornburg LLP

(57) ABSTRACT

Systems and methods for determining vehicle operational status in accordance with embodiments of the invention are disclosed. In one embodiment, a vehicle event detection device includes a low pass filter configured to sense a vehicle voltage and filter the sensed voltage to remove noise, and a plurality of first high pass filter configured to detect either a drop or a rise in the vehicle voltage and several low power comparators configured to determine whether the drop or rise in voltage is indicative of a vehicle event.

20 Claims, 7 Drawing Sheets

(56) References Cited

U.S. PATENT DOCUMENTS

2019/0131809 A1  5/2019  Park
2019/0156597 A1  5/2019  Santoro et al.

FOREIGN PATENT DOCUMENTS

| JP | 2003125449 A | 4/2003 |
|----|--------------|--------|
| KR | 20110278229 | 11/2011 |
| WO | 2008143532 | 11/2008 |
| WO | 2014038575 A1 | 3/2014 |
| WO | 2018002889 A1 | 1/2018 |

OTHER PUBLICATIONS

PCT Search Report & Written Opinion prepared for PCT/US2019/020102, completed May 17, 2019.
EP Search Report prepared for 19916896.4, completed on Sep. 8, 2022.
English translation of Japanese Office Action for Application No. 2021-550196, Nov. 8, 2022, 3 pages.

* cited by examiner

SYSTEMS AND METHODS FOR VEHICLE EVENT DETECTION

CROSS-REFERENCE TO RELATED APPLICATION

The present application is a continuation of and claims priority under 35 U.S.C. § 120 to U.S. patent application Ser. No. 16/289,320, entitled "SYSTEMS AND METHODS FOR VEHICLE EVENT DETECTION" by David B. Patton, now U.S. Pat. No. 11,187,739, which was filed on Feb. 28, 2019, the entirety of each of which is expressly incorporated herein by reference.

FIELD OF THE DISCLOSURE

The present invention relates to detecting vehicle events and in particular to waking a vehicle telematics device from a low power sleep mode based on detected changes in vehicle voltage.

BACKGROUND

Vehicle telematics systems are installed in a variety of applications including, but not limited to, fleet management, vehicle finance, vehicle maintenance, driver management, and/or fuel management. Telematics units are installed in vehicles to provide a variety of telematics functionality in the vehicle. This functionality includes, but is not limited to, emergency warning systems, navigation functionality, safety warnings, and automated driving assistance. Telematics units are also capable of recording data related to the operation of the vehicle and providing that information for analysis, whether in real-time or during a time when the vehicle is being serviced. This information can be used in a variety of applications, such as fleet tracking, shipment tracking, insurance calculations, and in vehicle management and service.

A common configuration for a vehicle telematics system is illustrated in FIG. 1. The vehicle telematics system 10 includes a processor 12 that is configured to communicate with a radio transceiver 13 and a GPS receiver 14. The processor 12, the radio transceiver 13, and the GPS receiver 14 are typically powered by a power supply 15 that is connected via a line to the vehicle's battery. The vehicle telematics system can optionally include its own battery 16 to enable operation when the vehicle battery is removed and/or to prevent depletion of the vehicle battery. In many instances, the vehicle telematics system monitors the ignition line of the vehicle to determine the ignition state of the vehicle using an ignition input interface 17 that is connected to the vehicle ignition line. Monitoring the vehicle ignition state can be useful for reasons including, but not limited to, reporting vehicle ignition state and/or managing power consumption.

A common problem encountered during installation of devices in a motor vehicle that connect to the vehicle's electrical system is that the installer may inadvertently connect an ignition input interface to a wire that is not the vehicle ignition line. U.S. Pat. No. 6,163,690, the disclosure of which is incorporated by reference herein in its entirety, notes the potential for the ignition sense line of a hands-free adapter for a mobile phone to be incorrectly connected to a line other than the ignition line due to installer error, which can result in the hands-free adaptor believing the ignition is always on and undesirably draining the vehicle's battery. U.S. Pat. No. 6,163,690 proposes a system that checks the correctness of the ignition sense line installation by monitoring the ignition sense line to determine whether the ignition line is switched off within a predetermined time period. In the event that the hands-free adaptor detects that the ignition line is always on, the hands-free adaptor provides an indication that it has been installed incorrectly.

SUMMARY

Systems and methods for determining vehicle operational status in accordance with embodiments of the invention are disclosed. In one embodiment provides a vehicle telematics device installed within a vehicle, including: a controller including a microprocessor and memory storing instructions; and an event detection circuit including: a low pass filter configured to sense a voltage and filter the sensed voltage to remove noise; a first high pass filter configured to receive the filtered voltage from the low pass filter and to detect a rise in the voltage; a first comparator configured to compare the rise in the voltage with a reference rise voltage amount and if the rise in the voltage is greater than the reference rise voltage amount, to trigger the event detection circuit to output a wake signal to the microprocessor of the controller; a second high pass filter configured to receive the filtered voltage from the low pass filter and to detect a drop in the voltage; a second comparator configured to compare the drop in the voltage with a reference drop voltage amount and if the drop in the voltage is less than the reference drop amount, to trigger the event detection circuit to output the wake signal to the microprocessor of the controller; where the microprocessor, on receiving the wake signal from the event detection circuit, is directed to wake the controller of the vehicle telematics device.

In another embodiment of the invention, the reference rise voltage amount and the reference drop voltage amount are set by a hardware reference amount.

In an additional embodiment of the invention, the reference rise voltage amount and the reference drop voltage amount are set by a software controlled digital-to-analog converter (DAC).

In yet another additional embodiment of the invention, the output wake signal is indicative of an occurrence of a vehicle event.

In still another additional embodiment of the invention, the vehicle event is at least one event selected from the group consisting of a vehicle engine starting, the vehicle engine being jump started, connecting a trailer to the vehicle, disconnecting a trailer from the vehicle, turning on an electric winch on the vehicle, turning on a starter motor of the vehicle, staring an alternator of the vehicle, connecting a battery to the vehicle, and disconnecting a battery from the vehicle.

In yet still another additional embodiment of the invention, the event detection circuit is a component of a vehicle telematics device and is used to wake the vehicle telematics device from asleep mode of operation.

In yet another embodiment of the invention, the high pass filters are configured to detect rapid changes in the vehicle voltage and to filter out slow changes in the vehicle voltage.

In still another embodiment of the invention, the microprocessor, on receiving the wake signal from the event detection circuit, is directed to confirm the occurrence of a vehicle event.

In yet still another embodiment of the invention, the microprocessor confirms the occurrence of the vehicle event by monitoring an ignition line of the vehicle to determine an operational status of the vehicle.

In yet another additional embodiment of the invention, the microprocessor, on receiving the wake signal from the event detection circuit, is directed to wake the vehicle telematics device from a sleep mode of operation.

Still another embodiment of the invention includes a vehicle event detection device, including: a microcontroller that includes a memory storing vehicle event detection instructions; and several analog-to-digital convertors (ADCs) configured to sense a vehicle voltage signal and to convert the analog vehicle voltage signal to a digital signal; where the vehicle event detection device is installed in a vehicle; and where the vehicle event detection device instructions instruct the microcontroller to: wake up from a sleep mode of operation; measure an instantaneous vehicle voltage using the several ADCs; compare the instantaneous vehicle voltage with an average vehicle voltage; if the difference between the instantaneous vehicle voltage and the average vehicle voltage is greater than a first threshold value or less than a second threshold value, output a wake signal to a controller of a vehicle telematics device, otherwise, to revert back to the sleep mode of operation.

In still another additional embodiment of the invention, the wake signal is transmitted to the controller of the vehicle telematics device to wake the vehicle telematics device from a sleep mode of operation.

In yet still another additional embodiment of the invention, the wake signal is indicative of an occurrence of a vehicle event.

In yet another embodiment of the invention, the vehicle event is at least one event selected from the group consisting of a vehicle engine starting, the vehicle engine being jump started, connecting a trailer to the vehicle, disconnecting a trailer from the vehicle, turning on an electric winch on the vehicle, turning on a starter motor of the vehicle, staring an alternator of the vehicle, connecting a battery to the vehicle, and disconnecting a battery from the vehicle.

In still another embodiment of the invention, the event detection device is a component of the vehicle telematics device.

In yet still another embodiment of the invention, the controller of the vehicle telematics device, on receiving the wake signal from the vehicle event detection device, is directed to confirm the occurrence of a vehicle event.

In yet another additional embodiment of the invention the controller confirms the occurrence of the vehicle event by monitoring an ignition line of the vehicle to determine an operational status of the vehicle.

In still another additional embodiment of the invention, the controller, on receiving the wake signal from the vehicle event detection device, is directed to wake the vehicle telematics device from a sleep mode of operation.

In yet still another additional embodiment of the invention, the first threshold and the second threshold are 2 volts.

In yet another embodiment of the invention, the first threshold is dependent on a type of vehicle event being detected.

BRIEF DESCRIPTION

FIG. 6 is a chart conceptually illustrating vehicle battery voltage when a vehicle's ignition state goes from OFF to ON.

DETAILED DESCRIPTION

Figure 1:
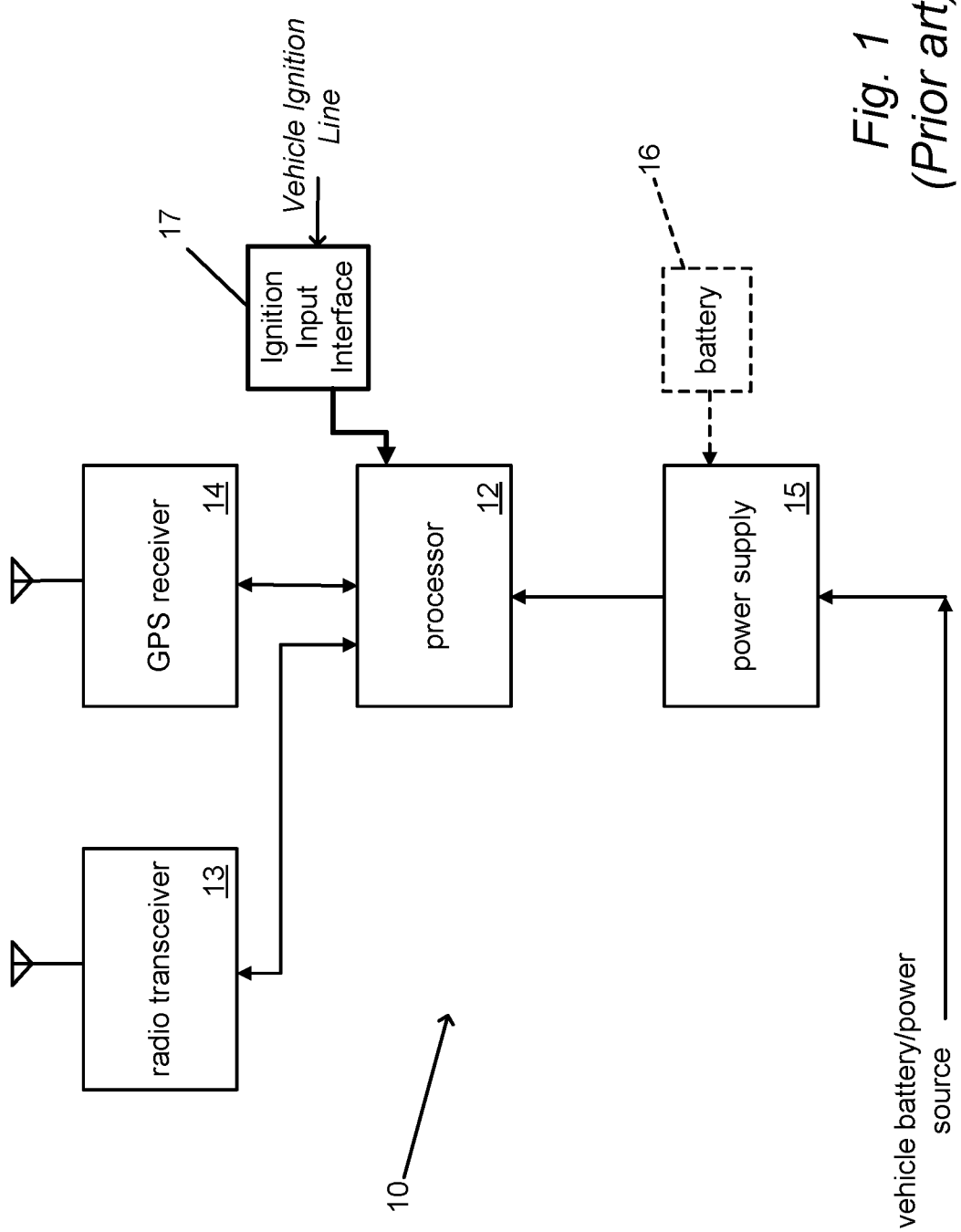
FIG. 1 is a conceptual illustration of a common configuration for a vehicle telematics system in accordance with an embodiment of the invention.

Turning now to the drawings, systems and methods for detecting vehicle events in order to wake a vehicle telematics device from a sleep mode in accordance with various embodiments of the invention are disclosed. In many instances, vehicle event detection devices can be installed in a location in a vehicle where a vehicle ignition line is unavailable to the device. In several embodiments, the vehicle ignition line is available and the vehicle event detection device does not utilize a connection to the vehicle ignition line. In a number of embodiments, vehicle ignition state (i.e. the operational status of the vehicle) is ascertained by monitoring the vehicle for signs indicative of the vehicle ignition state without directly connecting to the vehicle ignition line. Information indicative of vehicle ignition state (i.e. vehicle status data) can be ascertained by observing characteristics of the vehicle including but not limited to changes in vehicle voltages, and in particular detecting either a rapid drop or rapid rise in voltage indicative of a vehicle event.

In many embodiments, the vehicle event detection device provides a hardware implementation that can detect a variety of vehicle events while a vehicle telematics device is either powered off or in a sleep mode of operation. These vehicle events can include detecting that a vehicle is being started, which would thus trigger a waking up of the vehicle telematics device installed in the vehicle. In certain embodiments, the vehicle telematics device can then confirm that the event has occurred. In particular, to minimize the power being consumed, it may be beneficial to keep a vehicle telematics device in a low power sleep mode, or even a power off state while the vehicle is turned off. However, there is a need to still be able to detect vehicle events, such as the vehicle engine starting, while minimizing the amount of power being consumed. Accordingly, many embodiments provide a low power vehicle event detection device that is capable of detecting vehicle events while the vehicle telematics device is in a sleep mode of operation and the vehicle is turned off. Accordingly, certain embodiments provide a two phase event detection system that includes a hardware ignition detection circuit that detects a vehicle event such as vehicle engine starting, and upon detecting the vehicle event, may wake a controller of a vehicle telematics device that places the device into a low power state, whereby the controller may then verify the occurrence of the vehicle event. In certain embodiments, the controller can verify the vehicle event using a variety of mechanisms, including by monitoring an ignition line of the vehicle, by detecting vibrations indicative of engine idling from accelerometers, gyroscopes, and/or movement of the vehicle via GPS, among various other mechanisms.

In many embodiments, the vehicle event detection device is able to also detect certain other events in addition to (or as an alternative to) a vehicle engine starting that may also be desirable to detect including (but not limited to) whether the vehicle is connected to another vehicle to jump start the vehicle, turning on an electric winch of the vehicle, connecting or disconnecting a trailer to/from the vehicle, turning on a starter motor in various conditions including a weak battery and a good battery, detecting an alternator starting, detecting a voltage rise in an electric vehicle, disconnecting and/or connecting the vehicle battery, among numerous other detectable events that may cause a change in voltage within the vehicle. The vehicle event detection device may be configured to detect any of a variety of vehicle events while the vehicle telematics unit is in a sleep mode of operation.

In many embodiments, the vehicle event detection device may be implemented as a hardware circuit providing minimal power consumption. In several embodiments, the vehicle event detection device may be implemented as a combination of software and/or hardware. In particular, the vehicle event detection device may include a microcontroller that uses ADCs and software to monitor for rapid changes in a vehicle voltage indicative of a vehicle event. In other embodiments, the vehicle event detection device may be implemented as a software program for execution on a processor within the vehicle telematics unit installed on the vehicle.

In many embodiments, a hardware implementation of the vehicle detection device may use a low-pass filter to remove spurious noise followed by a set of high-pass filters that can detect either a drop in voltage or a rise in voltage. In several embodiments, high pass filters are used to ignore slow changes in a vehicle voltage. In certain embodiments, the amount of drop or rise can be set by a hardware reference signal. In several embodiments, the reference signal can be set by a software controlled digital-to-analog converter (DAC). The hardware reference signal and/or DAC signal may set forth the amount of voltage rise or drop needed in order to indicate that a vehicle event has occurred, such as the vehicle engine is being started. In many embodiments, the combination of detecting for either a drop or a rise in voltage enables detecting a vehicle start in various conditions, including weak battery, good battery, alternator started, a voltage rise in an electric vehicle, among others.

Several embodiments may use a combination of hardware and software to detect vehicle events. In particular, certain embodiments may use a microcontroller and several analog-to-digital convertors (ADCs) and software to monitor the vehicle voltage. Accordingly, the microcontroller may be in set into a sleep state and occasionally wake up to measure the vehicle voltage and make decisions accordingly. In certain embodiments, the vehicle event detection can operate even when the vehicle telematics device is in a constant sleep state and the software is not executing. Accordingly, many embodiments of the vehicle detection device are able to consume just a few microamperes of power when the vehicle telematics device has been turned off.

Although much of the following discussion references vehicle telematics systems, systems and methods in accordance with embodiments of the invention can be implemented in other devices that connect to a vehicle power supply. Systems and methods for using a device added to the vehicle after the manufacture of the vehicle without a direct connection to the vehicle ignition line that can be utilized in accordance with embodiments of the invention are described in U.S. Pat. No. 8,489,271, titled "Systems and Methods for Virtual Ignition Detection" and issued Jul. 16, 2013, the disclosure of which is hereby incorporated by reference in its entirety. The vehicle event detection device in accordance with many embodiments can be an addition to such systems that can enable even lower power operation while detecting events. Vehicle event detection devices for detecting vehicle events that trigger waking up vehicle telematics devices and/or other devices in accordance with embodiments are described below.

Vehicle Event Detection Device

Figure 2:
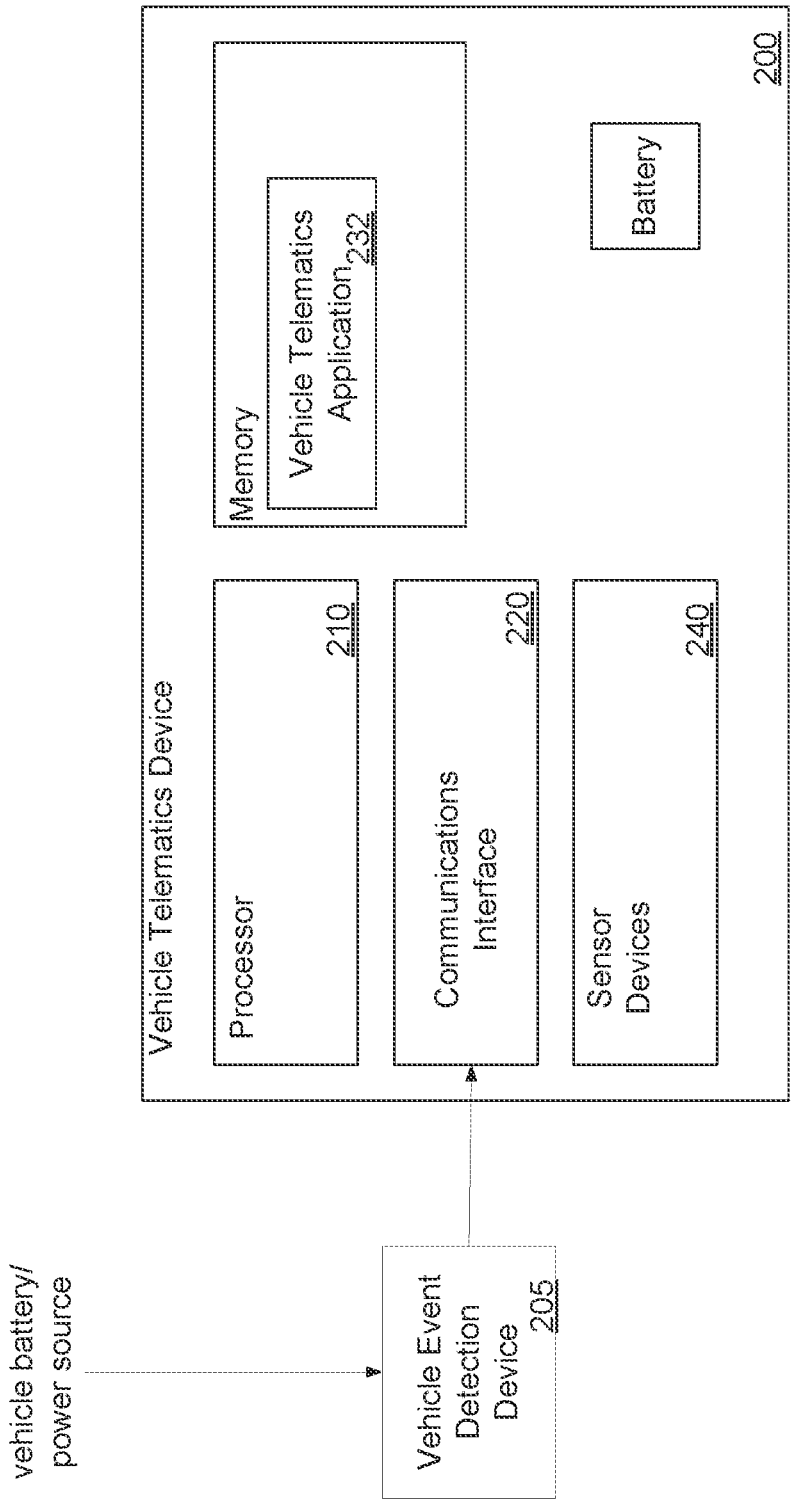
FIG. 2 is a conceptual illustration of a vehicle event detection device communicating with a vehicle telematics device in order to wake the vehicle telematics device from a sleep mode in accordance with an embodiment of the invention.

Vehicle event detection devices in accordance with embodiments of the invention can measure vehicle voltages and determine when the vehicle has been started, among various other events, based on rapid changes in the vehicle voltages, which can then be used to trigger a waking up of a vehicle telematics device from a power off or a low power/sleep mode of operation. A conceptual illustration of a vehicle event detection device communicating with a vehicle telematics device in order to wake the vehicle telematics device from a sleep mode in accordance with an embodiment of the invention is shown in FIG. 2. The vehicle event detection device 205 may monitor a vehicle voltage and detect vehicle events based on changes in the vehicle voltage. The vehicle event detection device 205 may send a signal to the vehicle telematics device 200 in order to wake the telematics device from a sleep state of operation. This allows the vehicle telematics device 200 to operate in a sleep mode in order to minimize the amount of power being consumed while the vehicle is turned off, and yet still be able to wake up based on detected vehicle events. Accordingly, the vehicle event detection device and the vehicle telematics device can provide a two phase ignition detection system whereby the vehicle event detection device provides a low power hardware ignition detection circuit that wakes a microprocessor of a controller of the vehicle telematics device into a low power state, which can attempt to verify the actual ignition event by monitoring the ignition line and/or through detection of vibration indicative of engine idling from accelerometers, gyroscopes, and/or movement of the vehicle via GPS. Accordingly, the vehicle event detection device may provide a low power hardware circuit that can detect events to wake a microprocessor of the vehicle telematics device.

The vehicle telematics device 200 may include a controller that includes processor 210 in communication with memory 230. The vehicle telematics device 200 can also include one or more communication interfaces 220 configured to send and receive data. In a number of embodiments, the communication interface 220 may be in communication with the processor 210, the memory 230, and/or the sensor device(s) 240. In several embodiments, the memory 230 can be any form of storage configured to store a variety of data, including, but not limited to, a vehicle telematics application 232. In many embodiments, vehicle telematics application 232 can be stored using an external server system and received by the vehicle telematics device 200 using the communications interface 220.

The processor 210 may be directed by the vehicle status determination application 232 to perform a variety of vehicle telematics processes. The vehicle telematics processes may include, upon receiving a wake signal from a vehicle event detection circuitry, confirming the occurrence of a vehicle event and/or waking from a sleep mode of operation. Vehicle telematics processes can also include obtaining data from a variety of sensor devices, determining vehicle state data, and generating vehicle trip data. Sensor devices 240 may include RPM sensors, voltage sensors, GPS receivers, noise sensors, vibration sensors, acceleration sensors, gyroscopes, and any other device capable of measuring data regarding a vehicle as appropriate to the requirements of specific applications of embodiments of the invention. Sensor devices 240 can be included within the vehicle telematics device 200 and/or located external to the vehicle telematics device 200. The vehicle telematics device 200 can communicate with external sensor devices, including the vehicle event detection device 205, using the communications interface 220, such as via a vehicle data bus, I/O interface, and/or a network connection as appropriate to the requirements of specific applications of embodiments of the invention.

Although a specific architecture for a vehicle event detection device for waking a vehicle telematics device in accordance with an embodiment of the invention is conceptually illustrated in FIG. 2, any of a variety of architectures, including those where the vehicle event detection device is included as part of the hardware and/or software within the vehicle telematics device and/or that store data or applications on disk or some other form of storage and are loaded into memory at runtime, can also be utilized. In a variety of embodiments, the memory 230 may include circuitry such as, but not limited to, memory cells constructed using transistors, that are configured to store instructions. Similarly, the processor 210 can include logic gates formed from transistors (or any other device) that are configured to dynamically perform actions based on the instructions stored in the memory. In several embodiments, the instructions are embodied in a configuration of logic gates within the processor to implement and/or perform actions described by the instructions. In this way, the systems and methods described herein can be performed utilizing both general-purpose computing hardware and by single-purpose devices.

Figure 3:
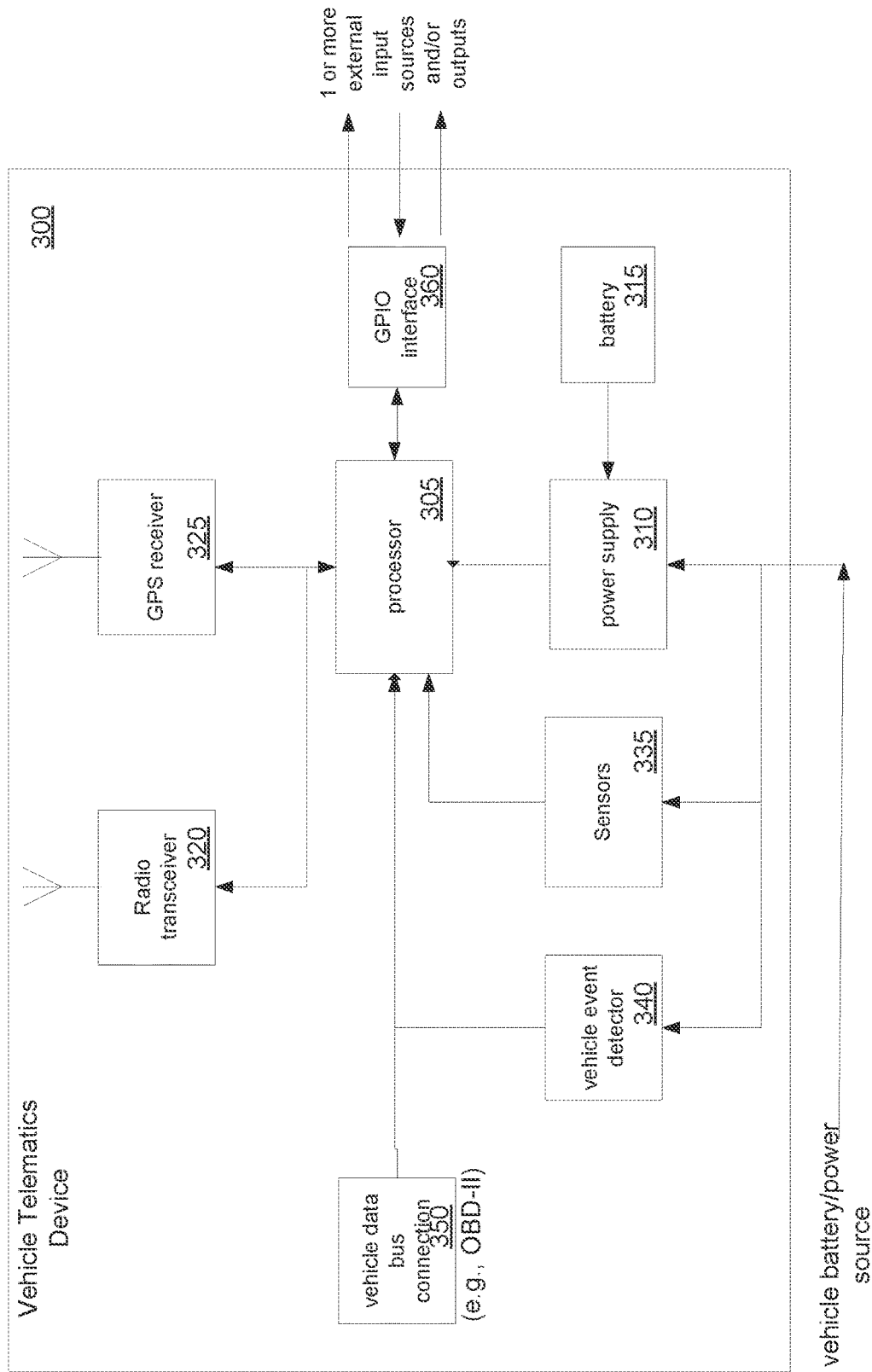
FIG. 3 is a conceptual illustration of a vehicle device that includes a vehicle event detector that is configured to detect vehicle events, including a vehicle ignition state without a direct connection to the vehicle ignition line in accordance with an embodiment of the invention.

In many embodiments, a vehicle event detection device that can be used to wake a vehicle device may be a part of the vehicle device. A vehicle device that includes a vehicle event detector that is configured to detect vehicle events, including a vehicle ignition state without a direct connection to the vehicle ignition line in accordance with several embodiments is illustrated in FIG. 3. In its simplest configuration, the vehicle device 300 includes a processor 305, and a power supply 310 that is connected to the vehicle power source. A battery can be optionally provided 315 to provide an alternative source of power to the power supply. When the device is a vehicle telematics system, the device 300 may also include a radio transceiver 320 and a GPS receiver 325. The device 300 may include a vehicle event detector 340 that monitors a vehicle voltage to detect for both rapid rises and/or rapid drops in the vehicle voltage and, based on the amount of the voltage rise and/or drop, the vehicle event detector can identify the occurrence of a vehicle event. Based on the detection of a vehicle event, the vehicle event detector 340 can wake the vehicle device 300, by communicating with the processor 305, from a sleep and/or power off mode of operation. In certain embodiments, the processor 305, upon receiving a wake signal from the vehicle event detector 340, may verify the detected event using various mechanisms, including by monitoring an ignition line of the vehicle, by detecting vibrations indicative of engine idling from data obtained from a variety of sensors, including accelerometers, gyroscopes, and/or movement data captured from a GPS of the vehicle.

The processor can also obtain position information via the GPS receiver 325 and communicate information, including but not limited to position information, with external devices over a wireless communication link using the radio transceiver 320. In a number of embodiments, the wireless transceiver is configured to communicate via a mobile or cell phone network. The processor 305 can also communicate to other vehicle devices connected to the vehicle bus via the vehicle bus though the vehicle data bus connection 350. The processor 305 can also communicate with one or more external input sources and/or outputs via the general-purpose input/output (GPIO) interface 360.

In many embodiments, the device illustrated in FIG. 3 can be configured to not need to directly connect to a vehicle ignition line in order to detect vehicle events, including a vehicle engine starting, among other events. Instead, the device can detect vehicle events using one of a variety of techniques that monitor for vehicle voltage drops and/or voltage rises, as described in detail below. Although a specific device configuration is shown in FIG. 3, devices in accordance with embodiments of the invention can include any of a variety of configurations, including where the vehicle event detector is implemented as stand alone device outside of the vehicle device and communicates with the vehicle device based on wake up events as appropriate to the requirements of specific applications in accordance with embodiments of the invention. Various techniques for detecting vehicle events based on monitoring for rapid changes in vehicle voltages in accordance with embodiments of the invention are discussed below.

Event Detection Device Architecture

As has previously been described, detecting a vehicle event may be based on detecting a rapid voltage drop or a voltage rise within the vehicle voltage system. As such, while a vehicle is functioning properly, the vehicle voltage may remain quite stable. There may be high-frequency noise caused by any of a variety of sources, including the vehicle alternator, computers, communications buses, actuators, among various others. However, the average voltage change due to these events and/or sources tends to be minimal. Furthermore, while the vehicle is running, there are various mechanisms for detecting these types of events are happening. However, when the vehicle is turned off, there are various events that are desirable to detect, but that may need an architecture that consumes a very minimal amount of power. As noted above, these events may include detecting an engine starting, being jump started, a vehicle being connected to a trailer, among various other events that may occur while a vehicle is turned off In order to detect these events while a vehicle is turned off, many embodiments provide for a low power consumption two phase event detection device that is able to detect events using a particular configuration of low power components, including low pass filters, high pass filters and very low power comparators, in order to monitor and detect rapid drops and rises in a vehicle voltage that would arise during a vehicle event, and upon detecting the vehicle events, outputting a signal to a controller of a vehicle telematics device to wake the telematics device from a sleep mode of operation. An architecture of a vehicle event detection device that uses a low pass filter in connection with a set of high pass filters and low power comparators to detect rapid changes in vehicle voltages in accordance with several embodiments of the invention is illustrated in FIG. 4.

In particular, the device includes a low pass filter 405 that filters a vehicle voltage to removes spurious noise followed by a set of high pass filters 410 and 415 to detect either a drop in voltage or a rise in voltage. The high pass filters 410 and 415 may ignore slow changes in vehicle voltage, which would not be indicative of a vehicle event such as an engine starting, which would likely cause a large and rapid change to the vehicle system voltage. The amount of drop or rise can be set by a hardware reference, illustrated as the Reference Fall signal 420 and the reference rise signal 425. Each of these signals can be provided as in input to a comparator 430 and 435. In particular, comparator 435 can compare the filtered signal received from the high pass filter 410 with the reference fall signal 420 in order to see if a sufficient voltage drop has occurred, and if so, a corresponding event one detected output signal may be output. Likewise, comparator 430 can compare the filtered signal received from the high pass filter 415 with the reference rise signal 425 to determine whether a sufficient voltage rise has occurred, and if so, a corresponding event two detected output signal may be output. In certain embodiments, the amount of the voltage drop or voltage rise of the reference fall 420 and reference rise 425 signals may be set by a software controlled digital-to-analog converter (DAC). In other embodiments, the amount of the voltage drop or voltage rise can be set of a hardware reference signal. In particular, the reference or DAC may determine the amount of voltage rise or drop needed to indicate that the vehicle has been started. The combination of detecting either a drop or a rise in voltage may enable detecting various events while the device is sleeping.

Figure 4:
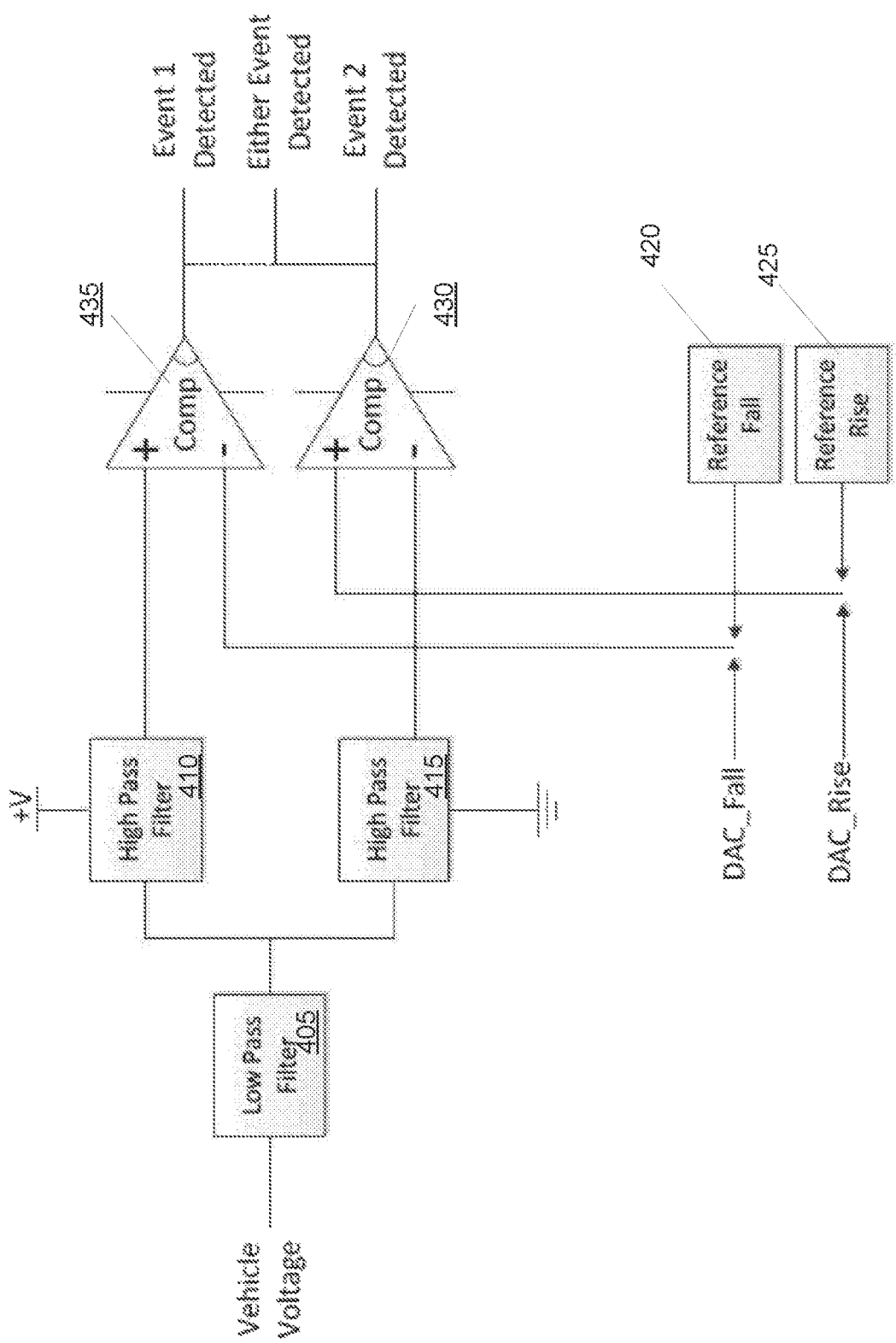
FIG. 4 is a conceptual illustration of an architecture of a vehicle event detection device that uses a low pass filter in connection with a set of high pass filters and low power comparators to detect rapid changes in vehicle voltages in accordance with an embodiment of the invention.

Although FIG. 4 illustrates a particular architecture of an event detection device using a set of low pass and high pass filters and low power comparators, any of a variety of architectures may be utilized as appropriate to the requirements of specific applications in accordance with various embodiments of the invention.

Figure 5:
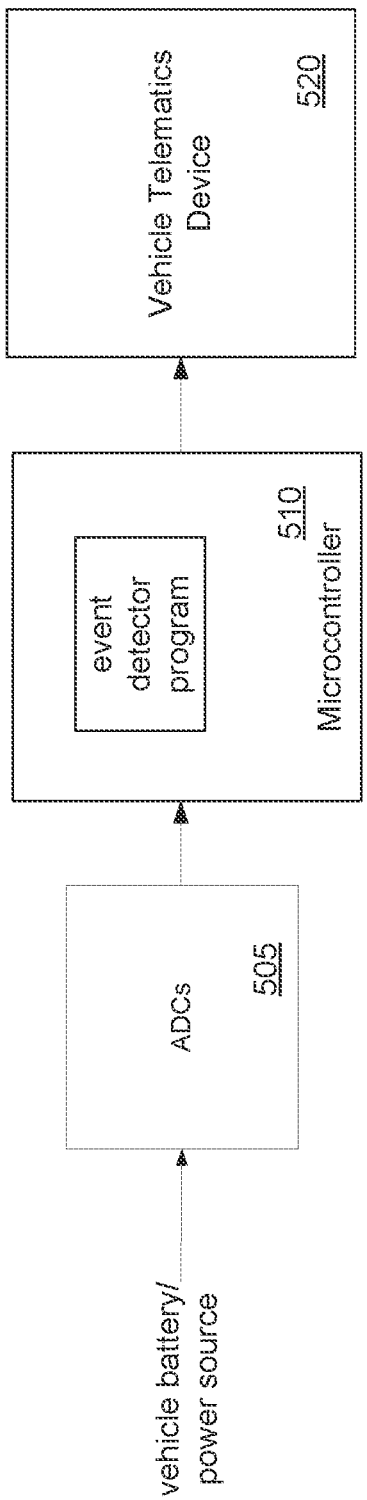
FIG. 5 is a conceptual illustration of an architecture of a vehicle event detection device implemented using a microcontroller and one or more ADCs in accordance with an embodiment of the invention.

Event detection devices can be implemented in hardware, a combination of hardware and software, and/or software. The power consumption may vary depending on the particular architecture utilized. In particular, certain embodiments may use a microcontroller and one or more ADCs in order to monitor the vehicle voltage. An architecture of a vehicle event detection device implemented using a microcontroller and one or more ADCs in accordance with various embodiments of the invention is illustrated in FIG. 5. In particular, the one or more ADCs 505 can sense a vehicle voltage provided from a power source such as a vehicle battery and provide the digital sensed amount to the microcontroller 510. The microcontroller 510 can be in a sleep state most of the time and occasionally wake up to measure the voltage and make a decision based on the voltage. In certain embodiments, the microcontroller 510 may use an event detector program stored in a memory of the microcontroller that can be used to monitor for rapid changes in the vehicle voltage, such as a rise or drop of at least 2 volts, and upon detecting this change, may output a wake device signal to vehicle device 520. The vehicle device 520, upon receiving the wake signal, may wake from a sleep mode of operation and may also confirm the occurrence of the vehicle event. Although FIG. 5 illustrates a particular architecture that uses a microcontroller and ADCs to monitor for rapid changes in vehicle voltages, any of a variety of architectures may be utilized as appropriate to the requirements of specific applications in accordance with various embodiments of the invention.

As described above, certain vehicle events may trigger a rapid drop or rise in a vehicle voltage. These events may include a vehicle engine starting and a vehicle engine stopping.

Figure 6:
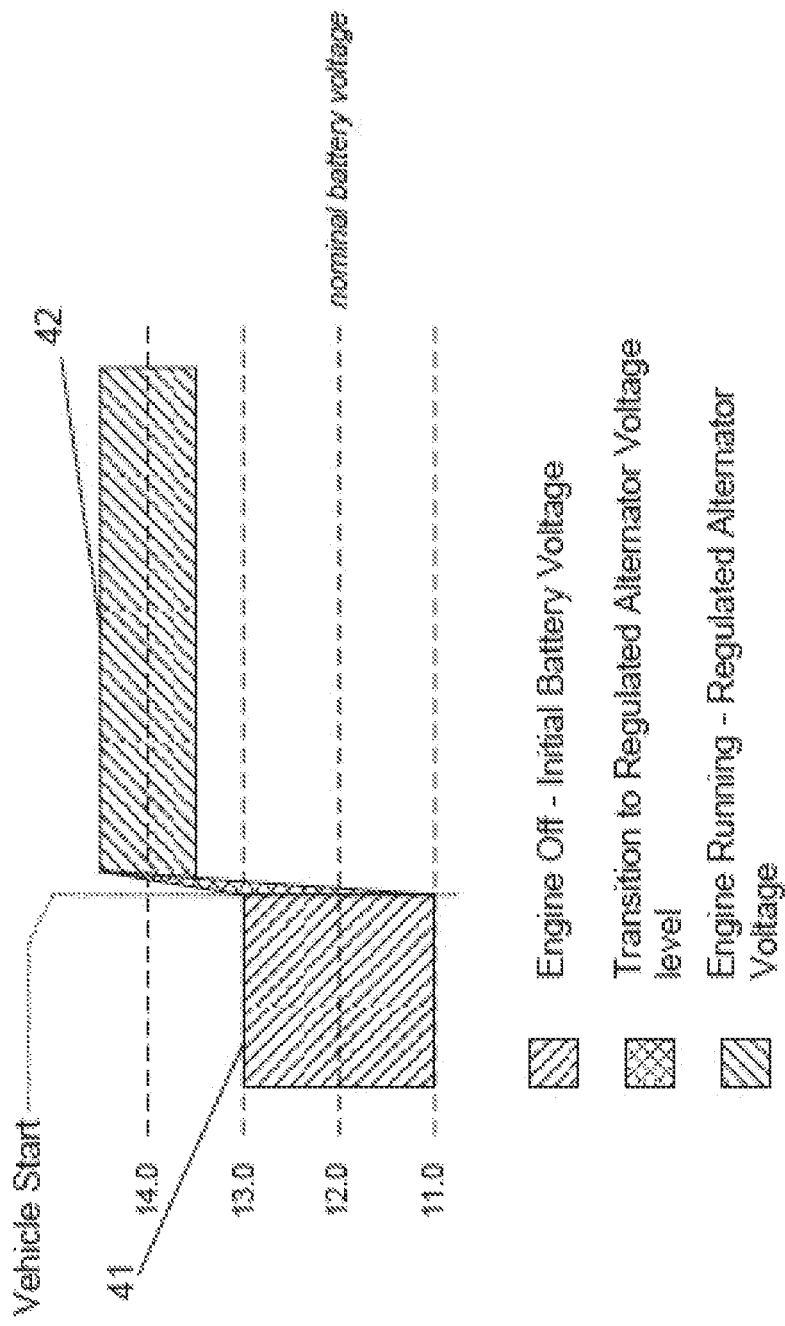

A chart conceptually illustrating vehicle battery voltage when a vehicle's ignition state goes from OFF to ON is illustrated in FIG. 6. At startup (transitions due to starter motor load are not shown), the voltage will immediately increase from the initial battery voltage 41 to the voltage output by the regulator of the vehicle alternator 42. The battery can initially be at a voltage ranging from heavily discharged to a voltage close to that of the alternator (especially when the vehicle was recently shut off and surface charge has not yet dissipated). The vehicle event detection device can look for increases (and/or decreases) in voltage level indicative of the ignition state transitioning from OFF to ON. In addition, the processor can combine information collected through the input voltage measurement interface in combination with other information including but not limited to information collected via a vehicle bus in order to detect a vehicle event and to wake up a vehicle device.

Figure 7:
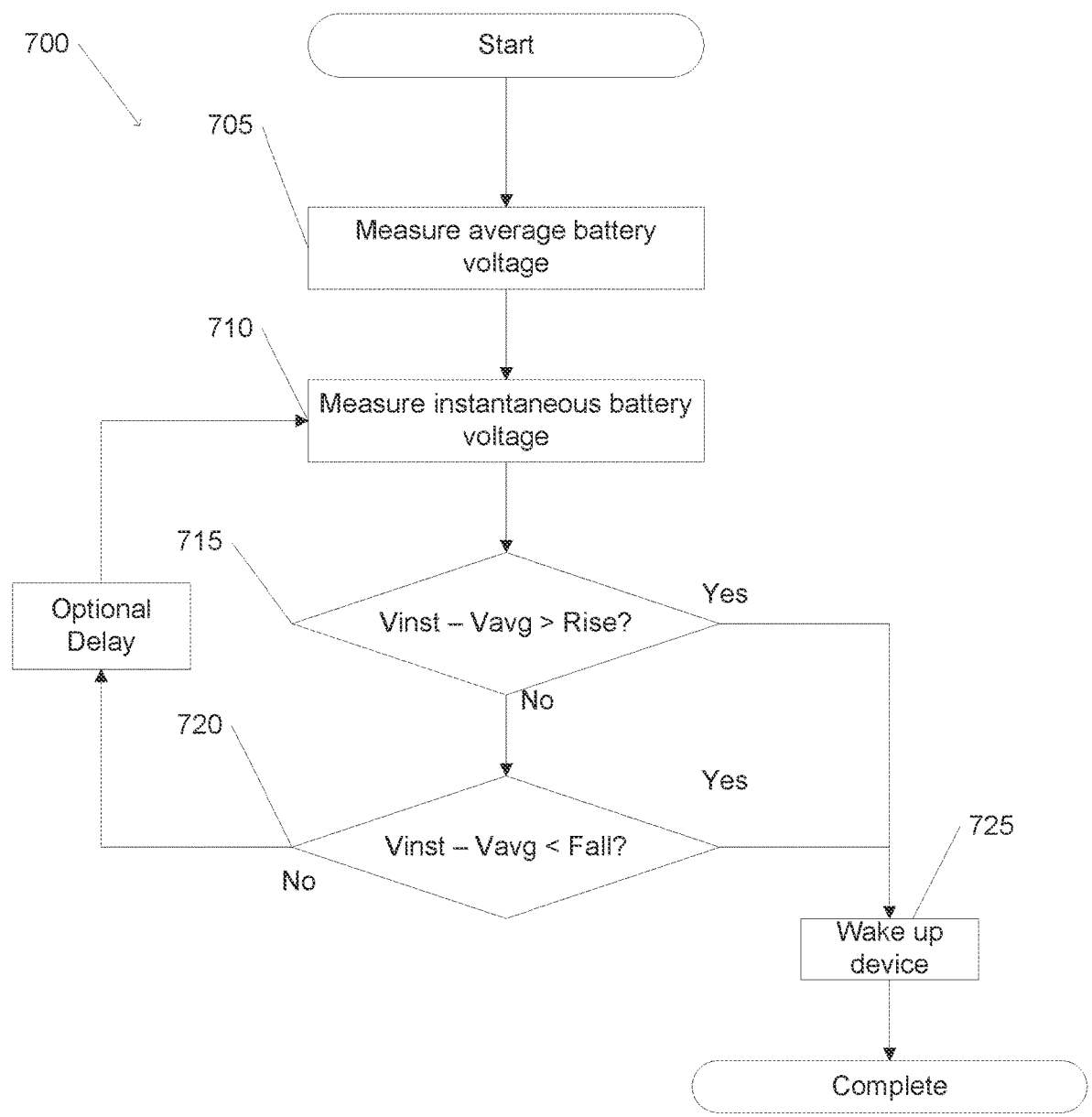
FIG. 7 illustrates a process for detecting vehicle events based on voltage changes in accordance with an embodiment of the invention.

A process for detecting vehicle events based on voltage changes in accordance with an embodiment of the invention is illustrated in FIG. 7. The process 700 can include measuring (705) the average battery voltage. The process can then measure (710) the instantaneous battery voltage. The process may determine (715) whether the difference between the instantaneous voltage and the average voltage is greater than a rise threshold reference value. In certain embodiments, the rise threshold value can be adjusted based on the type of event being detected. Furthermore, the values may be ascertained by experimental tests that monitor the corresponding voltage changes for particular events. For example, tests may reveal that a vehicle engine start may trigger a 2 volt rapid increase in the vehicle voltage system. Other events may utilize different threshold values and the process can identify a type of event based on the amount of voltage change being detected. If the difference between the instantaneous voltage and average voltage is greater than the rise threshold value, the process may wake up (725) a device. If the difference is less than the rise value, the process determines (720) whether the difference between the instantaneous voltage and the average voltage is less than a fall voltage threshold value, and if so, the process may wake up (725) the device. In certain embodiments, the device may confirm the occurrence of the vehicle event using various mechanisms, including monitoring an ignition line of the vehicle and/or using sensor data received from various vehicle sensors to determine the operational state of the vehicle engine. Otherwise, the process completes.

Specific processes for detecting vehicle events in accordance with embodiments of the invention are described above with respect to FIG. 7; however, any number of processes, including those that measure other electrical properties such as current among various others, can be utilized as appropriate to the requirements of a specific application in accordance with embodiments of the invention.

Although the present invention has been described in certain specific aspects, many additional modifications and variations would be apparent to those skilled in the art. In particular, any of the various processes described above can be performed in alternative sequences and/or in parallel (on the same or on different computing devices) in order to achieve similar results in a manner that is more appropriate to the requirements of a specific application. It is therefore to be understood that the present invention can be practiced otherwise than specifically described without departing from the scope and spirit of the present invention. Thus, embodiments of the present invention should be considered in all respects as illustrative and not restrictive. Accordingly, the scope of the invention should be determined not by the embodiments illustrated, but by the appended claims and their equivalents.

The invention claimed is:

1. A vehicle telematics device, comprising:
 a controller comprising a microprocessor and memory storing instructions, wherein the controller is configured to operate in a sleep mode of operation and a wake mode of operation and wherein the controller consumes less power while in the sleep mode relative to the wake mode; and
 an event detection circuit comprising:
  a low pass filter configured to filter, while the controller is in the sleep mode, a voltage of a battery of a vehicle to remove noise to produce a filtered voltage;
  a first high pass filter electrically coupled to the low pass filter to receive the filtered voltage and configured to detect, while the controller is in the sleep mode, a rise in the filtered voltage;
  a first comparator electrically coupled to the first high pass filter and configured to, while the controller is in the sleep mode, (i) compare the rise in the filtered voltage with a reference rise voltage amount and (ii) output a wake signal to the microprocessor of the controller in response to the rise in the filtered voltage being greater than the reference rise voltage amount, wherein the wake signal is indicative of an occurrence of a vehicle event;
  a second high pass filter electrically coupled to the low pass filter to receive the filtered voltage and configured to detect, while the controller is in the sleep mode, a drop in the filtered voltage;
  a second comparator electrically coupled to the second high pass filter and configured to, while the controller is in the sleep mode, (i) compare the drop in the filtered voltage with a reference drop voltage amount and (ii) output the wake signal to the microprocessor of the controller in response to the drop in the filtered voltage being less than the reference drop amount;
 wherein the microprocessor is configured to, in response to receipt of the wake signal form the event detection circuit, (i) change from the sleep mode to the wake mode and (ii) verify the occurrence of the vehicle event.

2. The vehicle telematics device of claim 1, wherein the reference rise voltage amount and the reference drop voltage amount are set by a hardware reference amount.

3. The vehicle telematics device of claim 1, wherein the reference rise voltage amount and the reference drop voltage amount are set by a software controlled digital-to-analog converter (DAC).

4. The vehicle telematics device of claim 1, further comprising an interface coupled to an ignition line of the vehicle.

5. The vehicle telematics device of claim 1, wherein the vehicle event is at least one event selected from the group consisting of a vehicle engine starting, the vehicle engine being jump started, connecting a trailer to the vehicle, disconnecting a trailer from the vehicle, turning on an electric winch on the vehicle, turning on a starter motor of the vehicle, staring an alternator of the vehicle, connecting a battery to the vehicle, and disconnecting a battery from the vehicle.

6. The vehicle telematics device of claim 1, further comprising a housing and wherein the controller and the event detection circuit are located in the housing.

7. The vehicle telematics device of claim 1, wherein the high pass filters are configured to detect rapid changes in the filtered voltage and to filter out slow changes in the filtered voltage.

8. The vehicle telematics device of claim 1, wherein to verify the occurrence of the vehicle event comprises to verify a voltage level of an ignition line of the vehicle.

9. The vehicle telematics device of claim 1, wherein to verify the occurrence of the vehicle event comprises to detect a vibration of the vehicle.

10. The vehicle telematics device of claim 1, wherein the microprocessor is configured to change from the wake mode to the sleep mode in response to the occurrence of the vehicle event not being verified.

11. A system for vehicle event detection, comprising:
 a vehicle telematics device including a controller configured to operate in a sleep mode of operation and a wake mode of operation and wherein the controller consumes less power while in the sleep mode relative to the wake mode; and
 a vehicle event detection device including:
  a microcontroller comprising a memory having stored therein vehicle event detection instructions; and
  a plurality of analog-to-digital convertors (ADCs) configured to sense an analog vehicle voltage signal and to convert the analog vehicle voltage signal to a digital signal;
 wherein the vehicle event detection device instructions instruct the microcontroller, while the vehicle telematics device is in the sleep mode, to:
  wake up from a sleep mode of operation;
  measure an instantaneous vehicle voltage using the plurality of ADCs;
  compare the instantaneous vehicle voltage with an average vehicle voltage; and
  output a wake signal to the controller of the vehicle telematics device in response to a determination that the difference between the instantaneous vehicle voltage and the average vehicle voltage is greater than a first threshold value or less than a second threshold value, wherein the wake signal is indicative of an occurrence of a vehicle event,
 wherein the controller of the vehicle telematics device is configured to, in response to receipt of the wake signal form the event detection circuit, (i) change from the sleep mode to the wake mode and (ii) verify the occurrence of the vehicle event.

12. The system of claim 11, wherein the vehicle telematics device further includes an interface configured to be coupled to an ignition line of the vehicle.

13. The system of claim 11, wherein the vehicle event detection device instructions further instruct the microcontroller to revert back to the sleep mode of operation in response to a determination that the difference between the instantaneous vehicle voltage and the average vehicle voltage is less than the first threshold value or greater than the second threshold value.

14. The system of claim 11, wherein the vehicle event is at least one event selected from the group consisting of a vehicle engine starting, the vehicle engine being jump started, connecting a trailer to the vehicle, disconnecting a trailer from the vehicle, turning on an electric winch on the vehicle, turning on a starter motor of the vehicle, staring an alternator of the vehicle, connecting a battery to the vehicle, and disconnecting a battery from the vehicle.

15. The system of claim 11, wherein the event detection device is a component of the vehicle telematics device.

16. The system of claim 11, wherein to verify the occurrence of the vehicle event comprises to verify a voltage level of an ignition line of the vehicle.

17. The system of claim 16, wherein to verify the occurrence of the vehicle event comprises to detect a vibration of the vehicle.

18. The system of claim 16, wherein the controller is configured to change from the wake mode to the sleep mode in response to the occurrence of the vehicle event not being verified.

19. The system of claim 11, wherein the first threshold and the second threshold are 2 volts.

20. The system of claim 11, wherein the first threshold is dependent on a type of vehicle event being detected.

* * * * *